United States Patent
Srinivasan et al.

(10) Patent No.: US 10,996,266 B2
(45) Date of Patent: May 4, 2021

(54) SYSTEM AND METHOD FOR TESTING VOLTAGE MONITORS

(71) Applicant: STMicroelectronics International N.V., Geneva (CH)

(72) Inventors: Venkata Narayanan Srinivasan, Greater Noida (IN); Rajesh Narwal, Greater Noida (IN); Srinivas Dhulipalla, Prakasam (IN)

(73) Assignee: STMICROELECTRONICS INTERNATIONAL N.V., Geneva (CH)

(*) Notice: Subject to any disclaimer, the term of this patent is extended or adjusted under 35 U.S.C. 154(b) by 98 days.

(21) Appl. No.: 16/536,462

(22) Filed: Aug. 9, 2019

(65) Prior Publication Data

US 2021/0041496 A1 Feb. 11, 2021

(51) Int. Cl.
*G01R 31/28* (2006.01)

(52) U.S. Cl.
CPC ..... *G01R 31/2879* (2013.01); *G01R 31/2856* (2013.01)

(58) Field of Classification Search
CPC .. G01R 31/2856; G01R 31/2879; H01L 22/34
See application file for complete search history.

(56) References Cited

U.S. PATENT DOCUMENTS

| | | | |
|---|---|---|---|
| 4,255,789 A * | 3/1981 | Hartford | F02P 5/1502 701/108 |
| 5,153,808 A * | 10/1992 | Juntunen | H04B 3/46 340/3.44 |
| 6,072,742 A | 6/2000 | Ooishi | |
| 6,643,180 B2 | 11/2003 | Ikehashi et al. | |
| 7,212,067 B2 | 5/2007 | Pasternak | |
| 7,916,441 B2 * | 3/2011 | Bagarelli | H02H 7/0838 361/78 |
| 8,044,536 B2 | 10/2011 | Nguyen et al. | |
| 8,487,673 B2 * | 7/2013 | Xiao | H03K 19/17764 327/143 |
| 8,856,559 B2 | 10/2014 | Alarcon et al. | |
| 9,329,210 B1 * | 5/2016 | Gupta | G05F 3/02 |
| 9,335,375 B2 | 5/2016 | Srinivasan | |
| 9,698,771 B1 | 7/2017 | Srinivasan et al. | |
| 10,613,561 B1 * | 4/2020 | Jeong | H03K 17/223 |

(Continued)

*Primary Examiner* — Patrick Assouad
*Assistant Examiner* — Demetrius R Pretlow
(74) *Attorney, Agent, or Firm* — Slater Matsil, LLP

(57) ABSTRACT

Circuits and methods for testing voltage monitor circuits are provided. In an embodiment, an integrated circuit (IC) includes power management unit (PMU), a set-reset (S-R) latch circuit, a multiplexer, and an AND gate circuit. A voltage monitor circuit of the PMU generates an output signal based on a difference between a received reference voltage and a received sense voltage from a functional supply. A power on reset (PoR) generator of the PMU generates a PoR signal based on a power up condition of the PMU. The S-R latch circuit generates an enable signal based on the output signal of the comparator circuit and the PoR signal. The multiplexer passes-through the output signal of the comparator circuit during a functional condition of the PMU. The AND gate circuit generates an enable signal based on an output of the multiplexer and an output of the S-R latch circuit.

25 Claims, 4 Drawing Sheets

(56) References Cited

U.S. PATENT DOCUMENTS

| | | | |
|---|---|---|---|
| 2007/0200610 A1* | 8/2007 | Bailly | H02M 3/33523 327/363 |
| 2007/0226795 A1* | 9/2007 | Conti | G06F 21/554 726/22 |
| 2009/0085685 A1* | 4/2009 | Guo | H03L 1/02 331/185 |
| 2009/0106609 A1* | 4/2009 | Sato | G06F 11/2236 714/726 |
| 2009/0204831 A1* | 8/2009 | Cousson | G06F 1/324 713/322 |
| 2010/0204946 A1 | 8/2010 | Warren et al. | |
| 2012/0212259 A1* | 8/2012 | Riva | H03F 3/45183 327/89 |
| 2013/0127441 A1* | 5/2013 | Tseng | G01R 19/16552 324/76.11 |
| 2013/0321071 A1* | 12/2013 | Pietri | H03K 17/22 327/540 |
| 2015/0247893 A1* | 9/2015 | Dao | H03K 17/22 324/750.3 |
| 2015/0362550 A1* | 12/2015 | Wibben | H02M 3/156 324/750.3 |
| 2016/0116925 A1* | 4/2016 | Freeman | H02M 3/33546 307/130 |
| 2019/0052076 A1* | 2/2019 | Asam | H02H 3/08 |
| 2019/0086474 A1 | 3/2019 | Srinivasan et al. | |
| 2019/0094296 A1 | 3/2019 | Srinivasan et al. | |
| 2019/0094301 A1 | 3/2019 | Srinivasan et al. | |

* cited by examiner

SYSTEM AND METHOD FOR TESTING VOLTAGE MONITORS

TECHNICAL FIELD

The present disclosure relates generally to electronic devices, and, in particular embodiments, to systems and methods for testing voltage monitors.

BACKGROUND

An integrated circuit (IC) may include a CORE domain and an emulation domain; each providing a different set of functionalities to the IC. The CORE domain encompasses the normal functional operation of the IC. The emulation domain is powered independently from the CORE domain and when the CORE domain is not powered may be used to provide a more limited range of functions. Each domain may include an associated power management unit. However, the emulation domain power management unit may be driven by a low voltage supply that is also sensed in the CORE domain power management unit.

A typical power management unit may include multiple voltage monitor circuits that may be used for a variety of built-in testing operations. Each voltage monitor circuit may be used to monitor a different threshold of the voltage supplied by a respective power supply of the power management unit. During production, and to achieve accurate voltage readings, each voltage monitor circuit is calibrated (i.e., trimmed to match a voltage threshold at a voltage value that is to be monitored by the voltage monitor circuit and tested to verify the accuracy of the trimmed value).

To test the entirety of the operational range of the voltage monitor circuits of the power management units, the entirety of the respective voltage domains are tested during trimming and verification.

Generally, in functional mode, the voltage monitors within a power management unit sense a functional supply; whereas in test mode, the voltage monitors within the power management unit sense a test supply.

Instances may arise in existing solutions, where the emulation domain power management unit may be exposed to the medium and high voltages that drive the CORE domain power management unit. Alternatively, a test operation of the voltage monitor circuits in the emulation domain may cause a reset of the test controller by the voltage monitor circuits in the CORE domain.

For example, GPIO pads used to interface with the test supply may exceed safe operating boundaries of the emulation domain power management unit. The emulation domain power management unit may become exposed to the high and medium voltages through an interface between the CORE domain GPIO pads and the emulation domain power management unit.

In another example, the test controller unit, which interfaces with the emulation domain, may be reset when the CORE domain low voltage supply is varied. The resetting of the test unit results in an exit from the test mode and an incomplete test operation by the voltage monitoring circuits of the emulation domain power management unit.

Low voltage to high voltage level shifters and high voltage to low voltage level shifters in the CORE domain continue to work in a power on reset (PoR) threshold of the high voltage supply and the low voltage supply. However, a low voltage to low voltage level shifter, used to translate signals between the low voltage supplies in the CORE domain and the emulation domain, do not work in the power on reset (PoR) threshold of the low voltage supplies.

Typically, a level shifter includes logic circuitry that determines whether the voltage supplies are in their respective ranges before operation. As a consequence of the low voltage to low voltage level shifter not working in the PoR threshold of low voltage supplies, the emulation domain may be in an unknown state during power up.

The trim bits provided to the voltage monitors, to place the voltage monitor circuits in the trimmed state, and the output of the voltage monitor circuits pass through level shifters that are disabled once the voltage monitor circuit has tripped. This forces the trim bits into a reset state.

Thus, during the trimming process of the voltage monitoring circuit in the emulation domain power management unit, as the level shifters are disabled and re-enabled multiple times at every trim code check, test time is increased. Furthermore, a direct observation of the voltage at the output of the voltage monitoring circuit is not possible.

A need therefore exists for systems and methods to reduce test time in devices having multiple voltage monitor circuits for power management units in an IC operating with a CORE domain and an emulation domain.

SUMMARY

Technical advantages are generally achieved by embodiments of this disclosure, which describe systems and methods for testing voltage monitors.

A first aspect relates to an integrated circuit (IC) that includes a power management unit (PMU), a set-reset (S-R) latch circuit, a multiplexer, and an AND gate circuit. The PMU includes a comparator circuit and a power on reset (PoR) generator. The comparator circuit is configured to generate an output signal based on a difference between a received reference voltage and a received sense voltage from a functional supply. The PoR generator is configured to generate a PoR signal based on a power up condition of the PMU. The S-R latch circuit is configured to generate an enable signal based on the output signal of the comparator circuit and the PoR signal of the PoR generator. The multiplexer is configured to pass-through the output signal of the comparator circuit during a functional condition of the PMU. The AND gate circuit is configured to generate an enable signal based on an output of the multiplexer and an output of the S-R latch circuit.

In a first implementation form of the IC according to the first aspect, the multiplexer is configured to pass through a signal from a test controller unit (TCU) during a test condition of the PMU. The signal from the TCU being a test data register bit that is forced to a logic high.

In a second implementation form of the IC, according to the first aspect as such or any preceding implementation form of the first aspect, the PMU is configured to operate using a first voltage from a first voltage supply. The IC further includes a test controller unit (TCU) and a level shifter. The TCU is configured to operate at a second voltage from a second voltage supply. The first voltage supply and the second voltage supply operate in a same voltage domain. The level shifter is configured to translate signals between the first voltage and the second voltage in an exchange of signals between the TCU and the PMU and between the PMU and a general purpose input output (GPIO) pad.

In a third implementation form of the IC, according to the first aspect as such or any preceding implementation form of the first aspect, the first voltage and second voltage have a voltage value in a range from about 0.7 volts (V) to about 1.15 V.

In a fourth implementation form of the IC, according to the first aspect as such or any preceding implementation form of the first aspect, the IC further includes a second PMU configured to operate at the second voltage. The second PMU is configured to monitor the first voltage and the second voltage.

In a fifth implementation form of the IC, according to the first aspect as such or any preceding implementation form of the first aspect, the PMU is configured to operate in an emulation domain and the second PMU and the TCU are configured to operate in a CORE domain.

In a sixth implementation form of the IC, according to the first aspect as such or any preceding implementation form of the first aspect, the PMU is configured to monitor the first voltage and the second voltage.

In a seventh implementation form of the IC, according to the first aspect as such or any preceding implementation form of the first aspect, the enable signal generated by the AND gate circuit is a signal to enable or disable the level shifter.

A second aspect relates to an integrated circuit (IC) that includes a power management unit (PMU), a set-reset (S-R) latch circuit, a multiplexer, and an AND gate circuit. The PMU is coupled to a functional voltage supply. The PMU includes a voltage monitor circuit configured to generate an output signal based on a comparison between a threshold voltage and a sense voltage of the functional voltage supply. The S-R latch circuit and the multiplexer are coupled to the PMU. The AND gate circuit is coupled to the multiplexer and the S-R latch circuit. The AND gate circuit is configured to generate an enable signal during a test or trim operation at the PMU based on an output of the multiplexer and the S-R latch circuit.

In a first implementation form of the IC according to the second aspect, the functional voltage supply is a first voltage supply. The IC further includes a test controller unit (TCU) and a level shifter. The TCU is coupled to a second voltage supply. The first voltage supply and the second voltage supply are configured to operate in a same voltage domain. The level shifter is coupled to the TCU, the PMU, the multiplexer, and the AND gate circuit.

In a second implementation form of the IC, according to the second aspect as such or any preceding implementation form of the second aspect, the first voltage supply and the second voltage supply have a supply voltage in a range from about 0.7 volts (V) to about 1.15 V.

In a third implementation form of the IC, according to the second aspect as such or any preceding implementation form of the second aspect, the IC further includes a second PMU coupled to the second voltage supply and the TCU.

In a fourth implementation form of the IC, according to the second aspect as such or any preceding implementation form of the second aspect, the PMU is configured to operate in an emulation domain and the second PMU and the TCU are configured to operate in a CORE domain.

In a fifth implementation form of the IC, according to the second aspect as such or any preceding implementation form of the second aspect, the PMU and the second PMU are each configured to monitor an output voltage of the first voltage supply and an output voltage of the second voltage supply.

In a sixth implementation form of the IC, according to the second aspect as such or any preceding implementation form of the second aspect, the enable signal generated by the AND gate circuit is an input signal to enable or disable the level shifter.

A third aspect relates to an integrated circuit (IC) that includes a power management unit (PMU), a set-reset (S-R) latch circuit, a multiplexer, and an AND gate circuit. The PMU is configured to generate, by a voltage monitor circuit of the PMU, an output signal based on a difference between a received reference voltage and a received sense voltage from a functional supply. The PMU is also configured to generate, by a power on reset (PoR) generator of the PMU, a PoR signal based on a power up condition of the PMU. The S-R latch circuit is configured to generate an enable signal based on the output signal generated by the PMU. The multiplexer is configured to pass-through the output signal of the PMU during a functional condition. The AND gate circuit is configured to generate an enable signal based on an output of the multiplexer and an output of the S-R latch circuit.

In a first implementation form of the IC according to the third aspect, the multiplexer is further configured to pass-through a signal from a test controller unit (TCU) during a test condition.

In a second implementation form of the IC, according to the third aspect as such or any preceding implementation form of the third aspect, the PMU is configured to operate using a first voltage supply. The IC further includes a test controller unit (TCU) and a level shifter. The TCU is configured to operate using a second voltage supply, the first voltage supply and the second voltage supply configured to operate in a same voltage domain. The level shifter is configured to translate signals between the TCU and the PMU and between the PMU and a general purpose input output (GPIO) pad.

In a third implementation form of the IC, according to the third aspect as such or any preceding implementation form of the third aspect, the first voltage supply and the second voltage supply are configured to operate at a voltage from about 0.7 volts (V) to about 1.15 V.

In a fourth implementation form of the IC, according to the third aspect as such or any preceding implementation form of the third aspect, the IC further includes a second PMU coupled to the second voltage supply and the TCU.

In a fifth implementation form of the IC, according to the third aspect as such or any preceding implementation form of the third aspect, the PMU and the second PMU are each configured to monitor an output voltage of the first voltage supply and an output voltage of the second voltage supply.

In a sixth implementation form of the IC, according to the third aspect as such or any preceding implementation form of the third aspect, the enable signal generated by the AND gate circuit is an input signal to enable or disable the level shifter.

A fourth aspect relates to a method that includes generating a comparison output signal based on a difference between a received reference voltage and a received sense voltage from a functional supply; generating a power on reset (PoR) signal based on a power up condition of a power management unit (PMU) and in accordance with a voltage supplied to the PMU being less than a threshold voltage; disabling a level shifter during the power up condition; generating a first enable signal based on the comparison output signal and the power on reset signal; passing-through the comparison output signal during a functional condition of the PMU; and generating a second enable signal based on the comparison output signal and first enable signal being active.

In a first implementation form of the method according to the fourth aspect, the method further includes enabling the level shifter based on the second enable signal, the level shifter used to translate signals between the PMU and a test controller unit (TCU) and between the PMU and a general purpose input output (GPIO) pad; controlling a test operation of the PMU using the TCU, the PMU operating in a first voltage domain, the TCU operating in a second voltage domain, a voltage range of the first voltage domain and a the second voltage domain being from about 0.7 volts (V) to about 1.15 V; passing-through a second enable signal from the TCU through the level shifter during a test condition of the PMU, the second enable signal being active high; generating a third enable signal based on the first enable signal and the second enable signal being an active signal; and directly observing a test result at a GPIO pad during the test operation of the PMU.

In a second implementation form of the method, according to the fourth aspect as such or any preceding implementation form of the fourth aspect, the method further includes monitoring a functional supply using a voltage monitor circuit of the PMU; and preventing a test controller unit (TCU) from entering into reset mode, the TCU supplied by a second voltage operating in a second voltage domain.

Embodiments can be implemented in hardware, software, or in any combination thereof. A computer program can perform the operations hereinabove. A device can be programmably arranged to perform the computer program.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
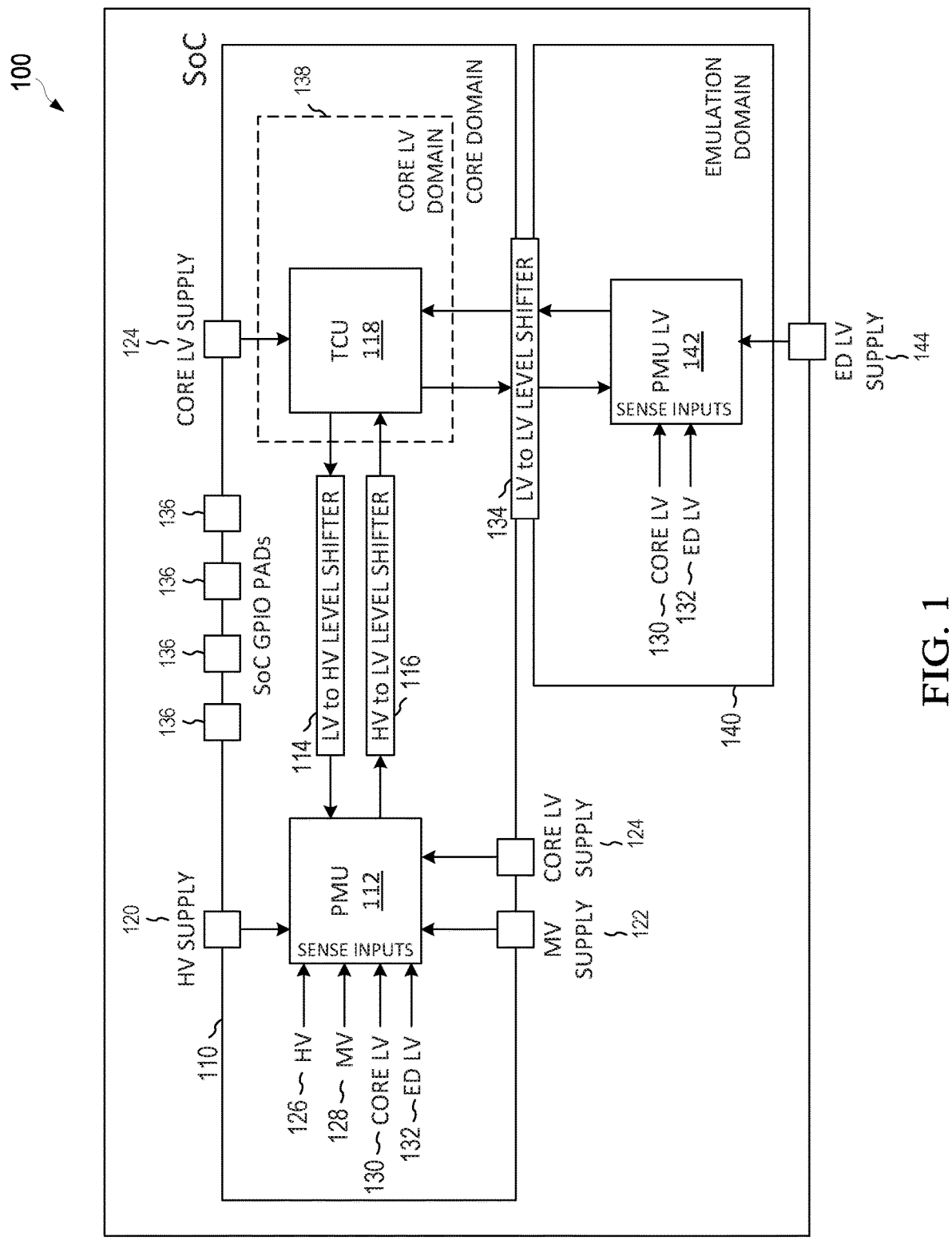
FIG. 1 is a block diagram of an embodiment system on chip (SoC) integrated circuit (IC) operating in core domain and emulation domain.

This disclosure provides many applicable inventive concepts that can be embodied in a wide variety of specific contexts. The specific embodiments are merely illustrative of specific configurations and do not limit the scope of the claimed embodiments. Features from different embodiments may be combined to form further embodiments unless noted otherwise. Variations or modifications described with respect to one of the embodiments may also be applicable to other embodiments. Further, it should be understood that various changes, substitutions, and alterations can be made herein without departing from the spirit and scope of this disclosure as defined by the appended claims.

The description below illustrates the various specific details to provide an in-depth understanding of several example embodiments according to the description. The embodiments may be obtained without one or more of the specific details, or with other methods, components, materials and the like. In other cases, known structures, materials, or operations are not shown or described in detail so as not to obscure the different aspects of the embodiments. References to "an embodiment" in this description indicate that a particular configuration, structure, or feature described in relation to the embodiment is included in at least one embodiment. Consequently, phrases such as "in one embodiment" that may appear at different points of the present description do not necessarily refer exactly to the same embodiment. Furthermore, specific formations, structures, or features may be combined in any appropriate manner in one or more embodiments.

While the inventive aspects are described primarily in the context of an analog design for test (DFT) environment with a specific range of voltage domains (i.e., low voltage, medium voltage, high voltage), it should also be appreciated that these inventive aspects are also applicable across any variation of voltage domains in a multi-voltage domain system.

Embodiments of this disclosure provide techniques for operation of the emulation domain in functional mode during power-up. In an embodiment, a subset of voltage monitor circuits in an emulation domain power management unit (PMU) are used to sense a functional supply voltage from a supply pad during test mode. The voltage monitor circuits, being supplied by an emulation domain low voltage supply, are configured to monitor a low voltage supply in the CORE domain. The remaining voltage monitor circuits in the emulation domain power management unit, also supplied by the emulation domain low voltage supply, are used to sense, and monitor, the emulation domain low voltage supply.

In various embodiments, the voltage monitor circuits in the CORE domain power management unit are in test mode. These voltage monitor circuits sense and monitor the low voltage, medium voltage, and high voltage supplies from a general purpose input output (GPIO) pad. The test controller unit (TCU) may then be used to test the emulation domain power management unit in the core domain for test and trimming of associated voltage monitor circuits. Advantageously, the test control unit (TCU) of the device is not reset when the low voltage supply in the CORE domain varies during testing of the voltage monitor circuits of the emulation domain power management unit.

In embodiments, low voltage to low voltage level shifters used to translate signals between the low voltage supplies in the CORE domain and the emulation domain remain enabled during test and trimming of the voltage monitor circuits of the emulation domain power management unit. Advantageously, the level shifters are enabled throughout the emulation domain voltage monitoring tests, which significantly reduces test time. Additionally, this advantageously provides a method for directly testing these voltage monitor circuits and to verify that tests are completed across the multi-voltage domain.

In addition, at power-up the emulation domain enters into functional mode such that test mode can subsequently become operational as desired. This allows an IC operating in both emulation domain and CORE domain to power up directly into functional mode without a power on reset threshold requirement to select between functional and test modes.

Furthermore, a significant test time reduction is realized by testing voltage monitor circuits in one domain (e.g., emulation domain) with test controller unit and GPIO pads from another domain (e.g., CORE domain). This realization is a consequence of the level shifters avoiding a disabled stated. These and other details are discussed in greater detail below.

FIG. 1 illustrates a block diagram of an embodiment system on a chip (SoC) integrated circuit (IC) 100, which may include a CORE domain no and an emulation domain (ED) 140, which may (or may not) be arranged as shown. The CORE domain no includes a power management unit (PMU) 112, an LV-to-HV level shifter 114, a HV-to-LV level shifter 116, and a test control unit (TCU) 118. The emulation domain 140 includes a low voltage power management unit (PMU LV) 142. In addition, a LV-to-LV level shifter 134 is shared between the CORE domain no and the emulation domain 140. The LV-to-LV level shifter 134 may be used to translate signals when the supply voltage is provided by different LV supply domains.

The SoC IC 100 may operate over a multi-voltage domain. The multi-voltage domain may include a low voltage domain, a medium voltage domain, and a high voltage domain. In some instances, the multi-voltage domain may include multiple low voltage domains, multiple medium voltage domains, and multiple high voltage domains.

Generally, a minority number of blocks of the PMU 112 are supplied by a medium voltage (MV) supply 122 or a core domain low voltage (CORE LV) supply 124. The majority numbers of blocks of the PMU 112, however, are supplied by the high voltage (HV) supply 120.

As an example, the HV supply 120 may operate over a range of about 2.7 volts (V) to about 6 V, the MV supply 122 may operate over a range of about 1.5 V to about 2.4 V, and the CORE LV supply 124 may operate over a range of about 0.7 V to about 1.15 V.

Regardless, the PMU 112 is configured to interface across the multi-voltage domain using, for example, a number of functional supply pads of the SoC IC 100.

In FIG. 1, one supply voltage from each voltage domain is shown; however, in some embodiments, the PMU 112 may be driven using multiple supplies, each operating over a different range of voltages within a voltage domain.

The PMU 112 additionally receives, at sense ports, input signals corresponding with voltages from each of the voltage domains that are to be monitored by the voltage monitor circuits of the PMU 112.

Generally, a voltage monitor circuit is used for a variety of built-in testing operations. Each voltage monitor circuit may be used to monitor a different threshold of the voltage supplied by a respective power supply.

As shown, the PMU 112 receives a high voltage (HV) signal 126, a medium voltage (MV) signal 128, a core domain low voltage (CORE LV) signal 130, and an emulation domain low voltage (ED LV) signal 132. Each input signal is monitored by one or more voltage monitor circuits of the PMU 112.

In the previous example, the HV supply 120 may have associated voltage monitor circuits corresponding with threshold voltages of 2.7 V, 3.0 V, 3.3 V, . . . , and 6 V; the MV supply 122 may have associated voltage monitor circuits corresponding with threshold voltages of 1.5 V, 1.6 V, 1.7 V, . . . , 2.4 V; and the CORE LV supply 124 may have associated voltage monitor circuits corresponding with threshold voltages of 0.7 V, 0.8 V, 0.9 V, . . . , 1.15 V. Each voltage monitor circuit of the PMU is configured to monitor a change in the supply in reference to corresponding threshold voltages.

The TCU 118 is driven using the CORE LV supply 124 through, for example, a functional supply pad. The test operations of the PMU 112 may be controlled by a test data register within the TCU 118. The TCU 118 operates in the CORE LV domain 138, which is a subset of the CORE domain 110.

The test data register within TCU 118 can interface with the PMU 112 using, for example, a joint test access group (JTAG) interface or the like. The TCU 118 may be a microprocessor, a digital signal processor, a field programmable gate array (FPGA), an application specific integrated circuit (ASIC), or the like.

The CORE domain no may include several externally accessible general purpose input output (GPIO) pads 136. In some embodiments, a GPIO pad 136 may provide the test supply voltage. In test mode, the test supply voltage is multiplexed with a functional supply voltage from a functional supply pad within the PMU 112. In test mode, the test supply voltage may be sensed by the voltage monitors within the PMU 112. In embodiments, a GPIO pad 136 may be used to provide results from operations in the core domain and the emulation domain.

The PMU LV 142 is driven by an emulation domain low voltage (ED LV) supply 144 through a functional supply pad of the SoC IC 100. In the previous example, the ED LV supply 144 may operate, similar to the CORE LV supply 124, over a range of about 0.7 to about 1.15 V.

The PMU LV 142 additionally receives, at sense ports, the CORE LV signal 130, and ED LV signal 132 that are to be monitored by the voltage monitors circuits of the PMU LV 142. As a result, the PMU LV 142 is configured to monitor voltages in the low voltage domain.

The PMU LV 142 operates independently from the PMU 112 (i.e., the emulation domain 140 is independently powered from the CORE domain 110). Thus, a non-transitory memory in the emulation domain 140 can store the code written in memory from a controller (e.g., CPU) in the CORE domain 110. This can even occur when the CORE domain no is not powered ON. The GPIO pad 136 in the CORE domain no may be inaccessible to the emulation domain 140 on the sense path, or the monitoring path, by the voltage monitor circuits in PMU LV 142. A risk exists that in functional mode, voltages, for example, up to 6 V can pass through the GPIO pads 136, but the output of voltage monitor circuits in the PMU LV 142 can be observed on the GPIO pads 136 after passing through the LV-to-LV level shifter 134 from the emulation domain 140 to the CORE domain no.

As noted hereinabove, the PMU LV 142 is supplied by a supply in the low voltage domain, without access to a supply in either the medium voltage or high voltage domains. As a result, unlike PMU 112, the blocks of the PMU LV 142 are driven only using the low voltage supply. In some embodiments, the PMU LV 142 may include voltage monitor circuits that are used to monitor thresholds of low voltage supplies in both the core domain (i.e., CORE LV signal 130) and the emulation domain (i.e., ED LV signal 132). The PMU LV 142 is configured to monitor (or alternatively sense) the input signals CORE LV 130 and ED LV 132. The ED LV 132 is a sense input to the PMU LV 142 that may power a circuit, for example, a voltage monitor circuit. The ED LV 132 is driven from ED LV supply 144. The ED LV 132, as a sense input, refers to an input signal that is being sensed or monitored by a voltage monitor circuit and compared to a threshold reference. Similar descriptions apply to the other voltage supplies in the CORE domain no and the emulation domain 140.

An LV-to-LV level shifter 134 may be shared between the CORE domain no and the emulation domain 140. Each of the level shifters (i.e., LV-to-HV level shifter 114, HV-to-LV level shifter 116, and the LV-to-LV level shifter 134) may be used to translate signals from one voltage domain to another voltage domain. As an example, the LV-to-HV level shifter 114 may be used to translate signals from the core low voltage domain to the high voltage domain; the HV-to-LV level shifter 116 may be used to translate signals from the high voltage domain to the core low voltage domain; and the LV-to-LV level shifter 134 may be used to translate signals between the emulation low voltage domain and the core low voltage domain.

Figure 2:
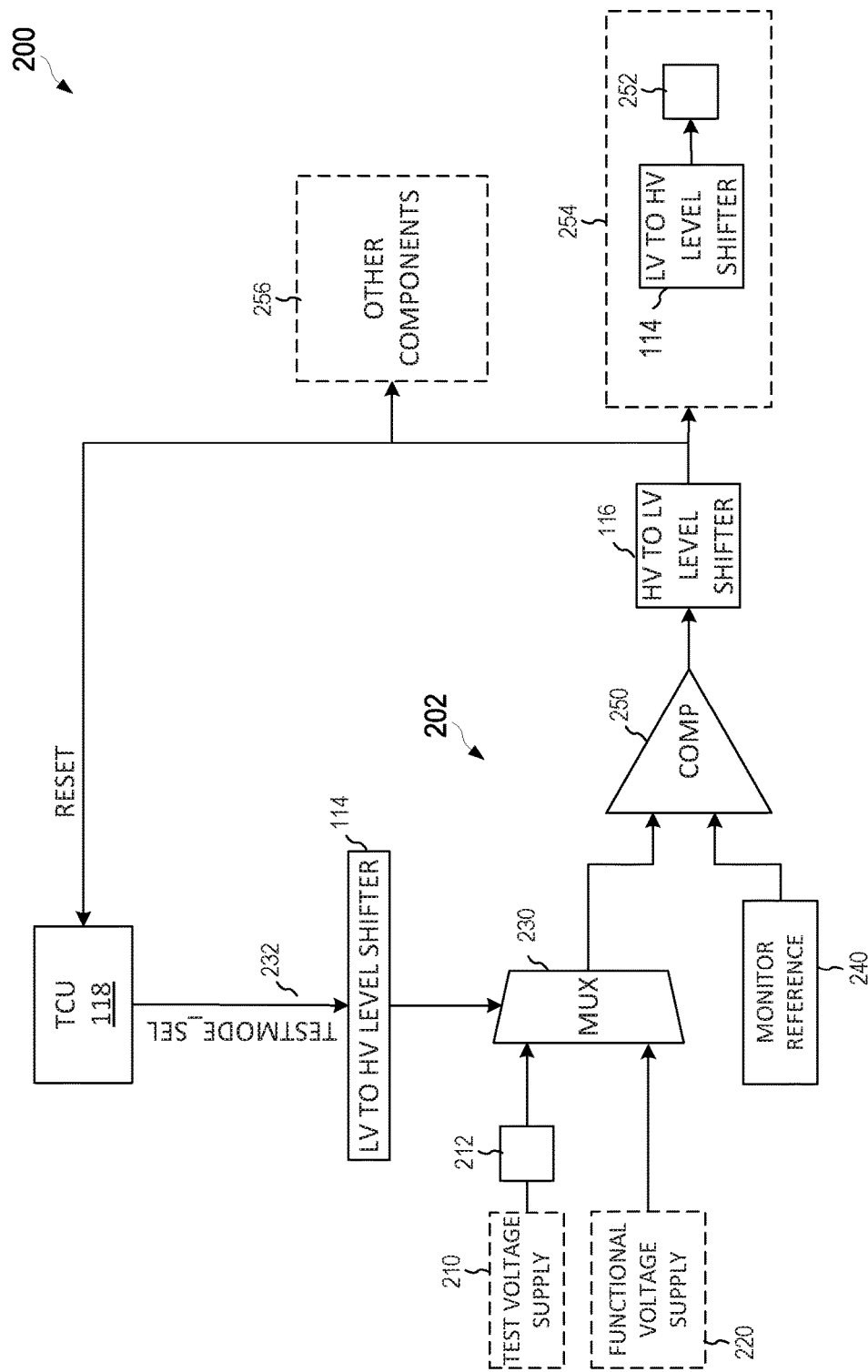
FIG. 2 is a block diagram of an embodiment voltage monitor circuit in a power management unit operating in the CORE domain.

FIG. 2 illustrates a block diagram 200 of an embodiment voltage monitor circuit 202 in PMU 112 operating in the CORE domain 110, which may (or may not) be arranged as shown. The voltage monitor circuit 202 includes a multiplexer 230 and a comparator 250. The TCU 118 is located in the CORE LV domain 138. It is noted that in FIG. 2, only one voltage monitor circuit 202 is shown for PMU 112. Additional voltage monitor circuits may be included to monitor the different voltages thresholds across the multi-voltage domain of the CORE domain 110.

A functional voltage supply 220, provides a functional voltage to a first input terminal of the multiplexer 230. A test voltage supply 210 provides a test voltage to a second input terminal of the multiplexer 230 via the pad 212. In an embodiment the pad 212 may correspond with a GPIO pad 136.

A test mode select signal (TESTMODE_SEL) 232 is controlled by the TCU 118 to the multiplexer 230. The test mode select signal 232 is translated from the low voltage domain to the high voltage domain using the LV-to-HV level shifter 114.

The test mode select signal 232 is used to assert a test mode or a functional mode operation at the voltage monitor circuit 202. Based on the value of the test mode select signal 232, the multiplexer 230 becomes a pass through circuit for a voltage supplied by either the test voltage supply 210 or the functional voltage supply 220.

As an example, in response to the test mode select signal 232 being equal to a logic value of '0', corresponding with the voltage monitor circuit 202 being in functional mode, the multiplexer 230 outputs the voltage of the functional voltage supply 220. Conversely, in response to the test mode select signal 232 being equal to a binary value of "1," corresponding with the voltage monitor circuit 202 being in test mode, the multiplexer 230 outputs the voltage of the test voltage supply 210.

The monitor reference 240 is trimmed, during a trimming process of the voltage monitor circuit 202, to a targeted threshold voltage. In embodiments, the trim value (TRIM_BIT) for the voltage monitor circuit 202 is provided by the TCU 118. In such an embodiment, the trim value may be translated from the low voltage domain to the high voltage domain using the LV-to-HV level shifter 114.

The comparator 250 compares the pass through voltage provided by the multiplexer 230 with a targeted threshold voltage from the monitor reference 240.

During functional operation, the comparator 250 compares the voltage from the functional voltage supply 220 to the targeted threshold voltage. The comparator 250 provides a digital signal indicative of whether the voltage from the functional voltage supply 220 is greater or less than the targeted threshold voltage. A change in the logical value of the digital signal indicates that the voltage from functional voltage supply 220 has exceeded or fallen below the targeted threshold. This may be used to indicate an over-voltage or under-voltage condition, based on the voltage that the voltage monitor circuit 202 is monitoring, of the functional voltage supply 220.

During test operation, the comparator 250 receives, as input signals, the voltage of the test voltage supply 210 and the targeted threshold voltage from the monitor reference 240. Accordingly, the comparator 250 outputs a digital signal, indicating which of the two inputs voltages is larger. During a ramp up or ramp down of the voltage from the test voltage supply 210, a change in logic value of the digital signal may be used to indicate the trimmed value of the voltage from the monitor reference. Thus, the digital signal may be used to determine whether the trimmed targeted threshold voltage, from the monitor reference 240, functions properly in reference to a known input voltage from the test voltage supply 210.

The digital signal at the output of the comparator 250 is received by various other components 256 of the SoC IC 100, the TCU 118—as a RESET input, and as the output at the output pad 254. In an embodiment, the output pad 254 may correspond to the GPIO pad 136. The digital signal may be translated from the low voltage domain to the high voltage domain using the LV-to-HV level shifter 114, which is provided at the pad 252. In an embodiment, the pad 252 may correspond with the GPIO pad 136.

Figure 3:
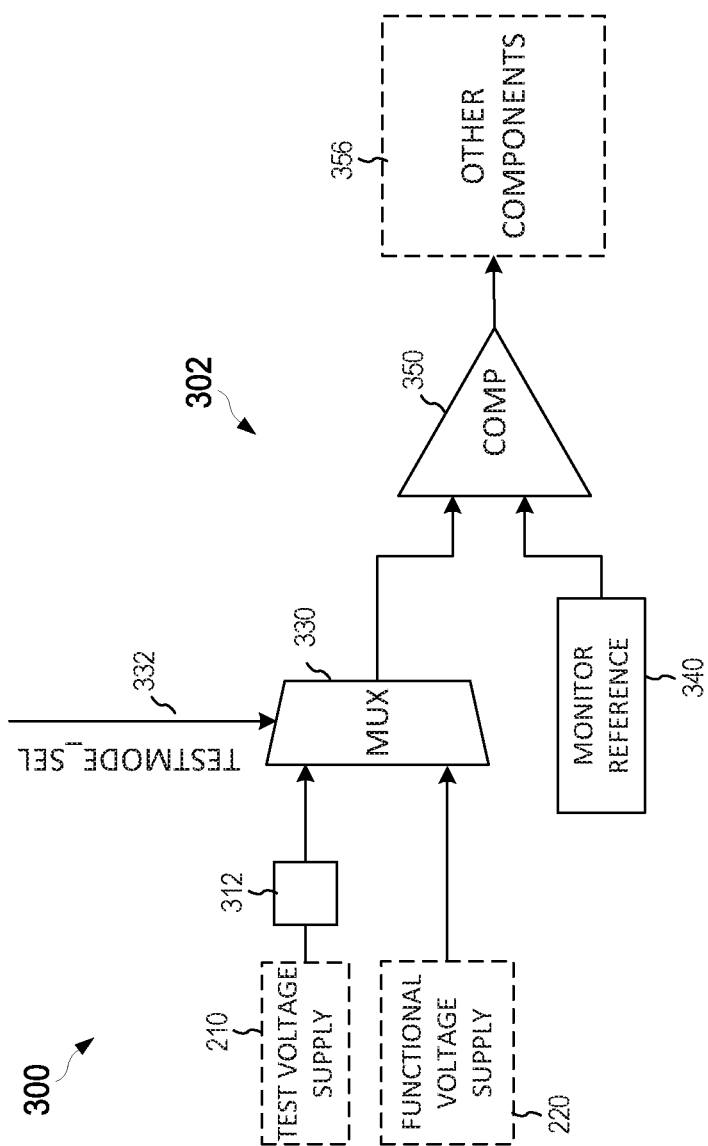
FIG. 3 is a block diagram of an embodiment voltage monitor circuit in a power management unit operating in the emulation domain.

FIG. 3 illustrates a block diagram 300 of an embodiment voltage monitor circuit 302 in PMU LV 142 operating in the emulation domain 140, which may (or may not) be arranged as shown. The voltage monitor circuit 302 includes a multiplexer 330 and a comparator 350. It is noted that in FIG. 3, only one voltage monitor circuit 302 is shown for PMU LV 142. Additional voltage monitor circuits may be included to monitor the different voltages thresholds of CORE LV 130 of the CORE domain 110.

Generally, the voltage monitor circuit 302 operates similarly to the voltage monitor circuit 202. A test mode select signal (TESTMODE_SEL) 332 is supplied to the multiplexer 330. The test mode select signal 332 is used to assert a test mode or a functional mode operation at the voltage monitor circuit 302. Based on the value of the test mode select signal 332, the multiplexer 330 becomes a pass through circuit for a voltage supplied by either the test voltage supply 210 through the test pad 312 or the functional voltage supply 220. In an embodiment, the test pad 312 may correspond with a GPIO pad 136.

The monitor reference 340 is trimmed, during a trimming process of the voltage monitor circuit 302, to a targeted threshold voltage. The comparator 350 compares the pass through voltage provided by the multiplexer 330 with a targeted threshold voltage from the monitor reference 340.

During functional operation, the comparator 350 compares the voltage from the functional voltage supply 220 to the targeted threshold voltage from the monitor reference 340. The comparator 350 provides a digital signal indicative of whether the voltage from the functional voltage supply 220 is greater or less than the targeted threshold voltage from the monitor reference 340. A change in the logical value of the digital signal indicates that the voltage from functional voltage supply 220 has exceeded or fallen below the targeted threshold. This may be used to indicate an over-voltage or under-voltage condition, based on the voltage that the voltage monitor circuit 302 is monitoring, of the functional voltage supply 220.

During test operation, the comparator 350 receives, as input signals, the voltage of the test voltage supply 210 and the targeted threshold voltage from the monitor reference 340. Accordingly, the comparator 350 outputs a digital signal, indicating which of the two inputs voltages is larger. During a ramp up or ramp down of the voltage from the test voltage supply 210, a change in logic value of the digital signal may be used to indicate the trimmed value of the voltage from the monitor reference. Thus, the digital signal may be used to determine whether the trimmed targeted threshold voltage, from the monitor reference 340, functions properly in reference to a known input voltage from the test voltage supply 210.

The digital signal at the output of the comparator 350 is provided to various other components 356 of the SoC IC 100.

As the PMU LV 142 operates in the emulation domain, which is powered by low voltage power supplies. The test voltage supply 210 is provided through the GPIO pad 136, which in functional mode allows voltage signals up to 6 V. For safe operation, the testing of the voltage monitor circuits in the PMU LV 142 cannot be done with the test voltage supply 210 provided from the GPIO pad 136. In functional mode, a voltage of about 6V that is passed through the GPIO pad 136 can be seen on the multiplexer 330. As the multiplexer 330 only supports up to about 1.15 V, an unsafe operating condition may occur.

Thus interconnect circuitry is needed between the GPIO pad 136 and the multiplexer 330 to ensure the safe operation of the PMU LV 142 across various operating conditions of: 1) CORE domain no Powered ON and emulation domain 140 Powered ON, 2) CORE domain 110 Powered ON and emulation domain 140 Powered OFF, and 3) CORE domain no Powered OFF and emulation domain 140 Powered ON. In embodiments, the interconnect circuitry can be an analog type circuit. This may increase design complexity, circuit footprint, and may require an additional test to verify proper operation of the interconnect circuitry.

To avoid an interconnect circuitry, the GPIO pad 136 and the multiplexer 330 may be removed from the sense path of the voltage monitor circuits of PMU LV 142. During test, the voltage monitor circuits of PMU LV 142 may also sense the functional voltage supply 220. The CORE LV 130 is varied to sense CORE LV 130 by the voltage monitor circuits of the PMU LV 142. As the voltage monitor circuits of PMU 112 may be in functional mode, some of these voltage monitor circuits may be also sensing CORE LV 130. It is noted that by default, the voltage monitor circuits of PMU 112 are in functional mode when the test mode signal 232 is at, for example, a logic value of '0'. This may cause the voltage monitor circuits in the PMU 112 to trip and reset the TCU 118. The resetting of the TCU 118 prevents the testing by the voltage monitor circuits in the PMU LV 142 that are used to sense the CORE LV 130. During the reset of the TCU 118, the trim bits may also get reset and the voltage monitor output path to the GPIO pads 136 may be blocked.

A different problem relates to the operation of the TCU 118 and the voltage monitor circuits when these components are operating in different low voltage domains. For proper operation, a signal generated by the TCU 118 has to pass through, for example, the LV-to-LV level shifter 134.

Typically, the enable signal for such level shifter is driven by an output of a test multiplexer that is selecting between a comparator output and a test controller bit. However, the enable signal of the level shifter is not designed to work from a power on reset (PoR) signal. As a result, during power up a loop condition is created. This prevents the emulation domain 140 from being powered up in a known state. Thus, the emulation domain 140 does not enter into functional mode at power up, nor can the emulation domain 140 enter into test mode at a later point.

One can remove the test multiplexer from the circuit, such that the low voltage to low voltage level shifter is enabled by an output of an AND gate receiving inputs from the output of the comparator 350 and a PoR signal. However, during trimming and testing of the voltage monitor circuits in the emulation domain 140, in the event that a voltage monitor circuit trips, the low voltage to low voltage level shifter becomes disabled. The disabling and re-enabling of the level shifters can occur multiple times during test. This may also prevent direct monitoring at the GPIO pad 136 in CORE domain no. Solutions to these and other related problems are described in the embodiments below.

Figure 4:
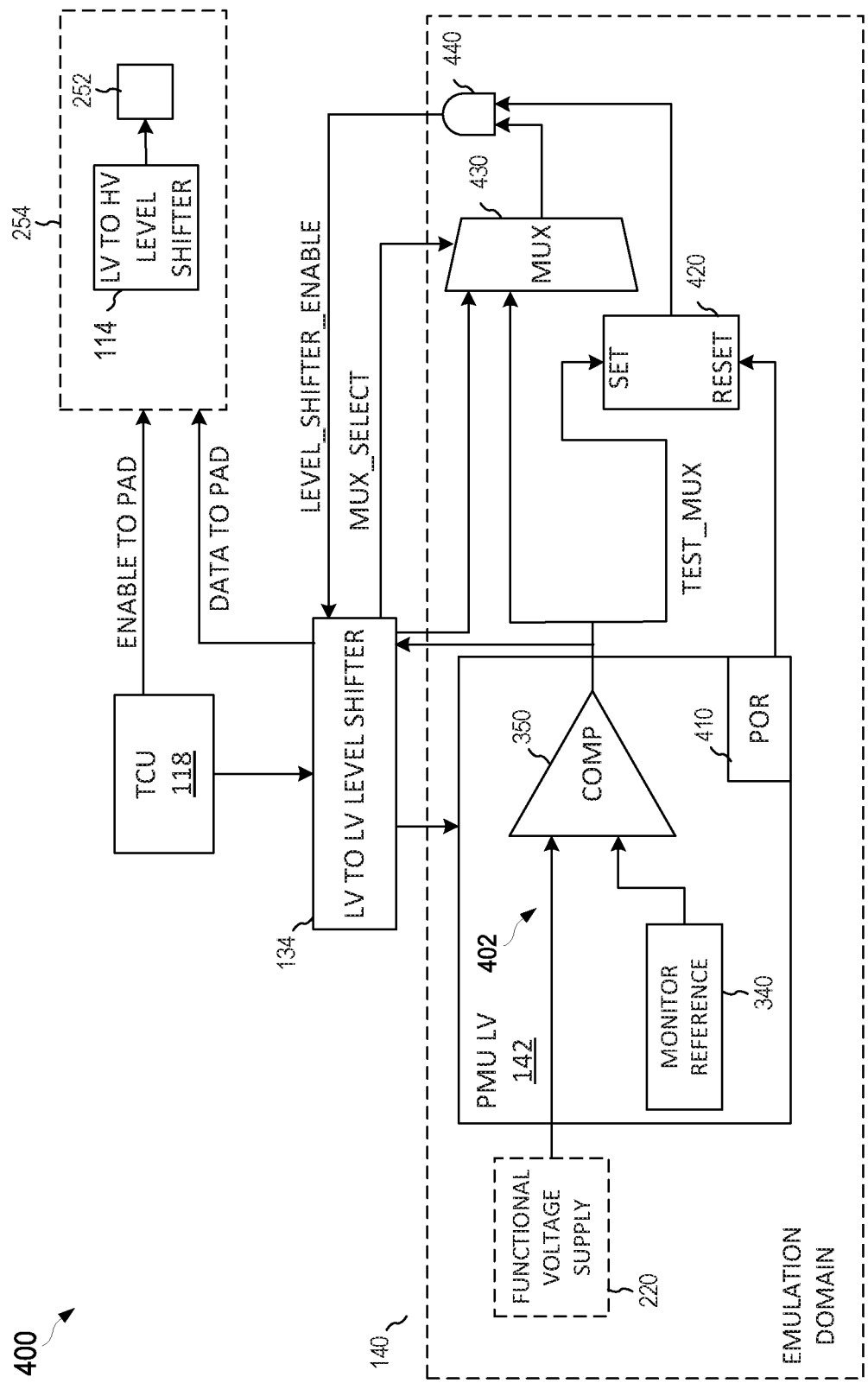
FIG. 4 is a block diagram of another embodiment voltage monitor circuit and a POR circuit in a power management unit and additional logic operating in the emulation domain.

FIG. 4 illustrates a block diagram 400 of an embodiment voltage monitor circuit 402 in PMU LV 142 operating in the emulation domain 140, which may (or may not) be arranged as shown. The PMU LV 142 includes a power on reset (PoR) generator 410, a set-reset (S-R) latch 420, a multiplexer 430, and an AND gate 440. In FIG. 4, the multiplexer 330 of FIG. 3 is removed and the functional voltage supply 220 is directly connected to the comparator 350.

The PoR generator 410 is a circuit that generates a PoR signal in response to a power on condition at the PMU LV 142. The PoR within PMU LV 142 follows the ED LV supply 144. In an embodiment, at power-up, the PoR signal is at logic value of '0', until the ED LV supply 144 crosses the PoR threshold (0.45 V). The PoR signal remains at "1" as long as the ED LV supply 144 remains above the POR threshold. The S-R latch 420 can be set to active-high or active-low and acts similar to a typical latch logic circuit. The SET input of the S-R latch 420 is coupled to the output of the comparator 350. The RESET input of the S-R latch 420 is coupled to the PoR generator 410. The S-R latch 420 is reset in response to a PoR signal generated by the PoR generator 410. The S-R latch 420 is set when the ED LV supply 144 is greater than the emulation domain voltage monitor threshold.

The multiplexer 430 receives a first input signal from the output of the comparator 350 and a second input signal from the TCU 118. The second input signal is translated from the CORE LV domain to the emulation LV domain after passing through the LV-to-LV level shifter 134. The output of the multiplexer 430 is selected from between the first input signal and the second input signal based on multiplexer select (MUX_SELECT) signal provided by the TCU 118 through the LV-to-LV level shifter 134.

The AND gate 440 receives the output of the multiplexer 430 and the output of the S-R latch 420 and provides an enable/disable (LEVEL_SHIFTER_ENABLE) signal. The loop is broken at power-up due to the PoR signal generated by the PoR generator 410. In response to the triggering of the PoR signal, the output of the AND gate 440 and the LEVEL_SHIFTER_ENABLE signal is at logic value of '0'. This is equivalent to a disable signal for the LV-to-LV shifter 134 (i.e., as the ED LV supply 144 is greater than the PoR signal generated by the PoR generator 410 and the ED LV supply 144 is less than the emulation domain 140 voltage monitor threshold). As the LV-to-LV shifter 134 is disabled, the output signal of the LV-to-LV shifter 134 is forced to a logic value of '0'. Thus, the select bit (i.e., MUX_SELECT) of the multiplexer 430 is at a logic value of '0'. This corresponds to a selection of the comparator 350 by the multiplexer 430. As ED LV supply 144 becomes greater than the emulation domain voltage monitor threshold, the output of the S-R latch 420 is high (i.e., enabled), the output of the multiplexer 430 corresponds to the output of the comparator 350, and the AND gate 440 is set to high (i.e., enabled). As the AND gate 440 is high, the LV-to-LV level shifter 134 is enabled. The enablement of the LV-to-LV level shifter 134 allows the exchange of signals between the CORE LV domain 138 and the emulation domain.

In such a configuration, the comparator 350 compares the targeted threshold voltage from the monitor reference 340 with the low voltage provided by the functional voltage supply 220 (i.e., CORE LV sense supply signal 130). It is noted that the input supply to the comparator 350 is the sense supply signals from the SENSE INPUTS of the PMU LV 142. The TCU 118 places the voltage monitor circuit of the PMU 112 in test mode using the test mode signal 232 (e.g., test mode signal 232 set to "1"). This selects the test voltage supply 210 to be passed through the GPIO pad 136. The test voltage supply 210 is forced to a voltage above the targeted threshold voltage of the monitor reference 240. The comparator 250 remains at a logic value of '1'. During the testing of the low voltage monitor circuits within PMU LV 142 and during the sensing of the CORE LV 130, the CORE LV supply 124 may be varied. The CORE LV 130 may be sensed by the voltage monitor circuits within the PMU LV 142 through the sense input of the CORE LV 130 signal. When functional supply is varied, it is sensed by the voltage monitor circuits through the inputs of the respective PMU's at the SENSE INPUTS. As the test voltage supply 210 is passed through the GPIO pad 136 to the PMU 112, the system does not trip. The resulting condition prevents a reset condition at the TCU 118 from voltage monitor circuits of PMU 112 operating in the CORE domain 110. This in turn allows the testing of the low voltage monitor circuits within the PMU LV 142, due to the trim bits being passed from the TCU 118 that is located in the CORE LV domain 138. The output of the low voltage monitor circuits within the PMU LV 142 can be monitor at the GPIO pad 136 in the CORE domain 110.

During the trim and test operations of the voltage monitor circuits within the PMU LV 142, the multiplexer 430 is set by the TCU 118 such that the output of the multiplexer 430 is equal to the value forced from TCU 118 through the second input of the multiplexer 430, which at this time is forced to a logic value of '1'. Therefore, even if a voltage monitor circuit in PMU LV 142 is tripped, both inputs to the AND gate 440 remain high. This is due to the TCU 118 forcing a second input of the multiplexer 430 to a logic value of '1'. The output of the multiplexer 430 is then at a logic value of '1'. The S-R latch 420 is still not reset, and the output is at a logic value of '1'. The LV-to-LV level shifter 134 remains enabled and the trim bits are passed from the TCU 118 in the CORE LV domain 138. The output of the low voltage monitor circuits within the PMU LV 142 can be observed on the GPIO pad 136 in the CORE domain 110.

Although the description has been described in detail, it should be understood that various changes, substitutions, and alterations may be made without departing from the spirit and scope of this disclosure as defined by the appended claims. The same elements are designated with the same reference numbers in the various figures.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
a power management unit (PMU) comprising a comparator circuit and a power on reset (PoR) generator, the comparator circuit configured to generate an output signal based on a difference between a received reference voltage and a received sense voltage from a functional supply, the PoR generator configured to generate a PoR signal based on a power up condition of the PMU;
a set-reset (S-R) latch circuit configured to generate an enable signal based on the output signal of the comparator circuit and the PoR signal of the PoR generator;
a multiplexer configured to pass-through the output signal of the comparator circuit during a functional condition of the PMU; and
an AND gate circuit configured to generate an enable signal based on an output of the multiplexer and an output of the S-R latch circuit.

2. The integrated circuit of claim 1, wherein the multiplexer is configured to pass through a signal from a test controller unit (TCU) during a test condition of the PMU, the signal from the TCU being a test data register bit that is forced to a logic high.

3. The integrated circuit of claim 1, wherein the PMU is configured to operate using a first voltage from a first voltage supply, the integrated circuit further comprising:
a test controller unit (TCU) configured to operate at a second voltage from a second voltage supply, the first voltage supply and the second voltage supply operating in a same voltage domain; and
a level shifter configured to translate signals between the first voltage and the second voltage in an exchange of signals between the TCU and the PMU and between the PMU and a general purpose input output (GPIO) pad.

4. The integrated circuit of claim 3, wherein the first voltage and second voltage have a voltage value in a range from about 0.7 volts (V) to about 1.15 V.

5. The integrated circuit of claim 3, further comprising a second PMU configured to operate at the second voltage, the second PMU configured to monitor the first voltage and the second voltage.

6. The integrated circuit of claim 5, wherein the PMU is configured to operate in an emulation domain and the second PMU and the TCU are configured to operate in a CORE domain.

7. The integrated circuit of claim 3, wherein the PMU is configured to monitor the first voltage and the second voltage.

8. The integrated circuit of claim 3, wherein the enable signal generated by the AND gate circuit is a signal to enable or disable the level shifter.

9. An integrated circuit comprising:
a power management unit (PMU) coupled to a functional voltage supply, the PMU comprising a voltage monitor circuit configured to generate an output signal based on a comparison between a threshold voltage and a sense voltage of the functional voltage supply;
a set-reset (S-R) latch circuit coupled to the PMU;
a multiplexer coupled to the PMU; and
an AND gate circuit coupled to the multiplexer and the S-R latch circuit, the AND gate circuit configured to generate an enable signal during a test or trim operation at the PMU based on an output of the multiplexer and the S-R latch circuit.

10. The integrated circuit of claim 9, wherein the functional voltage supply is a first voltage supply, the integrated circuit further comprising:
a test controller unit (TCU) coupled to a second voltage supply, the first voltage supply and the second voltage supply configured to operate in a same voltage domain; and
a level shifter coupled to the TCU, the PMU, the multiplexer, and the AND gate circuit.

11. The integrated circuit of claim 10, wherein the first voltage supply and the second voltage supply have a supply voltage in a range from about 0.7 volts (V) to about 1.15 V.

12. The integrated circuit of claim 10, further comprising a second PMU coupled to the second voltage supply and the TCU.

13. The integrated circuit of claim 12, wherein the PMU is configured to operate in an emulation domain and the second PMU and the TCU are configured to operate in a CORE domain.

14. The integrated circuit of claim 12, wherein the PMU and the second PMU are each configured to monitor an output voltage of the first voltage supply and an output voltage of the second voltage supply.

15. The integrated circuit of claim 10, wherein the enable signal generated by the AND gate circuit is an input signal to enable or disable the level shifter.

16. An integrated circuit comprising:
a power management unit (PMU) configured to:
generate, by a voltage monitor circuit of the PMU, an output signal based on a difference between a received reference voltage and a received sense voltage from a functional supply, and
generate, by a power on reset (PoR) generator of the PMU, a PoR signal based on a power up condition of the PMU;
a set-reset (S-R) latch circuit configured to generate an enable signal based on the output signal generated by the PMU;
a multiplexer configured to pass-through the output signal of the PMU during a functional condition; and
an AND gate circuit configured to generate an enable signal based on an output of the multiplexer and an output of the S-R latch circuit.

17. The integrated circuit of claim 16, wherein the multiplexer is further configured to pass-through a signal from a test controller unit during a test condition.

18. The integrated circuit of claim 16, wherein the PMU is configured to operate using a first voltage supply, the integrated circuit further comprising:
a test controller unit (TCU) configured to operate using a second voltage supply, the first voltage supply and the second voltage supply configured to operate in a same voltage domain; and
a level shifter configured to translate signals between the TCU and the PMU and between the PMU and a general purpose input output (GPIO) pad.

19. The integrated circuit of claim 18, wherein the first voltage supply and the second voltage supply are configured to operate at a voltage from about 0.7 volts (V) to about 1.15 V.

20. The integrated circuit of claim 18, further comprising a second PMU coupled to the second voltage supply and the TCU.

21. The integrated circuit of claim 20, wherein the PMU and the second PMU are each configured to monitor an output voltage of the first voltage supply and an output voltage of the second voltage supply.

22. The integrated circuit of claim 18, wherein the enable signal generated by the AND gate circuit is an input signal to enable or disable the level shifter.

23. A method comprising:
generating a comparison output signal based on a difference between a received reference voltage and a received sense voltage from a functional supply;
generating a power on reset (PoR) signal based on a power up condition of a power management unit (PMU) and in accordance with a voltage supplied to the PMU being less than a threshold voltage;
disabling a level shifter during the power up condition;
generating a first enable signal based on the comparison output signal and the power on reset signal;
passing-through the comparison output signal during a functional condition of the PMU; and
generating a second enable signal based on the comparison output signal and first enable signal being active.

24. The method of claim 23, further comprising:
enabling the level shifter based on the second enable signal, the level shifter used to translate signals between the PMU and a test controller unit (TCU) and between the PMU and a general purpose input output (GPIO) pad;
controlling a test operation of the PMU using the TCU, the PMU operating in a first voltage domain, the TCU operating in a second voltage domain, a voltage range of the first voltage domain and a the second voltage domain being from about 0.7 volts (V) to about 1.15 V;
passing-through a second enable signal from the TCU through the level shifter during a test condition of the PMU, the second enable signal being active high;
generating a third enable signal based on the first enable signal and the second enable signal being an active signal; and
directly observing a test result at a GPIO pad during the test operation of the PMU.

25. The method of claim 23, further comprising:
monitoring a functional supply using a voltage monitor circuit of the PMU; and
preventing a test controller unit (TCU) from entering into reset mode, the TCU supplied by a second voltage operating in a second voltage domain.

* * * * *